United States Patent
Cheng et al.

(10) Patent No.: US 12,207,574 B1
(45) Date of Patent: Jan. 21, 2025

(54) RECONFIGURABLE HETEROJUNCTION MEMRISTOR, CONTROL METHOD, FABRICATION METHOD AND APPLICATION THEREOF

(71) Applicant: HUAZHONG UNIVERSITY OF SCIENCE AND TECHNOLOGY, Hubei (CN)

(72) Inventors: Xiaomin Cheng, Hubei (CN); Haobin Li, Hubei (CN); Yunhao Luo, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 0 days.

(21) Appl. No.: 18/748,017

(22) Filed: Jun. 19, 2024

Related U.S. Application Data

(63) Continuation of application No. PCT/CN2023/130405, filed on Nov. 8, 2023.

(30) Foreign Application Priority Data

Sep. 22, 2023 (CN) .......................... 202311236059.6
Sep. 22, 2023 (CN) .......................... 202311240104.5

(51) Int. Cl.
*H10N 70/20* (2023.01)
*G11C 13/00* (2006.01)
(Continued)

(52) U.S. Cl.
CPC ..... *H10N 70/8833* (2023.02); *G11C 13/0007* (2013.01); *G11C 27/005* (2013.01);
(Continued)

(58) Field of Classification Search
CPC . H10N 70/8833; H10N 70/826; H10N 70/021
See application file for complete search history.

(56) References Cited

U.S. PATENT DOCUMENTS

2017/0271410 A1   9/2017   Zhang et al.
2022/0278274 A1*  9/2022   Offrein ............... H10N 70/826

FOREIGN PATENT DOCUMENTS

CN   111933794   11/2020
CN   115528169   12/2022
(Continued)

*Primary Examiner* — Mark V Prenty
(74) *Attorney, Agent, or Firm* — JCIPRNET

(57) ABSTRACT

The disclosure discloses a reconfigurable heterojunction memristor, a control method, a fabrication method, and an application thereof. The functional layer designed by the disclosure comprises a PN heterojunction of n-AgO and p-$Ag_2O$ or a PN heterojunction of n-$CuO_2$ and p-CuO. In the analog type, multiple resistance state performance is exhibited based on charge trapping and releasing, and self-rectification characteristics are exhibited, without the need for a selector, which facilitates large-scale integration; in the digital type, the presence of Ag/Cu ions in the layer helps to form Ag/Cu conductive filaments, the switching threshold voltage is small, and the advantages of fast switching speed and low switching power consumption are provided. The disclosure realizes a PN heterojunction device of an N-type oxide layer and a P-type oxide layer through electrochemical principles, and is analog type-digital type reconfigurable between a self-rectifying analog type device and a digital type device.

9 Claims, 6 Drawing Sheets

(51) Int. Cl.
  *G11C 27/00* (2006.01)
  *H10B 63/00* (2023.01)
  *H10N 70/00* (2023.01)
(52) U.S. Cl.
  CPC ........... *H10B 63/00* (2023.02); *H10N 70/026* (2023.02); *H10N 70/24* (2023.02); *H10N 70/841* (2023.02)

(56) References Cited

FOREIGN PATENT DOCUMENTS

CN    117135997    11/2023
DE    102016205860    10/2017

\* cited by examiner

RECONFIGURABLE HETEROJUNCTION MEMRISTOR, CONTROL METHOD, FABRICATION METHOD AND APPLICATION THEREOF

CROSS-REFERENCE TO RELATED APPLICATION

This application is a continuation of international application of PCT application serial no. PCT/CN2023/130405, filed on Nov. 8, 2023, which claims the priority benefit of China application no. 202311236059.6 filed on Sep. 22, 2023 and China application no. 202311240104.5 filed on Sep. 22, 2023. The entirety of each of the above-mentioned patent applications is hereby incorporated by reference herein and made a part of this specification.

BACKGROUND

Technical Field

The disclosure belongs to the field of micro-nano electronic devices, and particularly relates to a reconfigurable heterojunction memristor, a control method, a fabrication method, and an application thereof.

Description of Related Art

Memristors may be divided into analog type memristors and digital type memristors according to the way the conductance changes. Digital type memristors have a distinct threshold voltage and a high on/off ratio and good state retention capability, and may be used as memories or selectors. The resistance of the analog type memristor may continuously increase and decrease with the regulation of the external signal, which simulates neural synaptic plasticity and stores synaptic weights, and the memristor may be used in computing units.

In the memristive neural network structure, the mixed use of analog type and digital type devices can obtain an image recognition process with continuously adjustable accuracy and speed. The coexistence of analog type and digital type memristors in a single device provides a feasible solution for achieving controllable neuromorphic learning and facilitates the development of brain-like morphological computing.

However, in the current research on heterojunction memristors, the coexistence of analog type with multi-resistance state characteristics and digital type memristors has not been achieved.

SUMMARY

In view of the defects of the related art, the purpose of the disclosure is to provide a reconfigurable heterojunction memristor, a control method, a fabrication method, and an application thereof, aiming to solve problems caused by the coexistence of analog type and digital type of heterojunction memristors.

To achieve the above purpose, in the first aspect, the disclosure provides a reconfigurable heterojunction memristor, which includes a substrate, a bottom electrode, a heterojunction intermediate layer, and a top electrode stacked sequentially from bottom to top.

The heterojunction intermediate layer includes an N-type oxide layer in contact with the bottom electrode, and a P-type oxide layer in contact with the top electrode.

The N-type oxide layer is silver peroxide, and the P-type oxide layer is silver oxide.

Alternatively, the N-type oxide layer is copper peroxide, and the P-type oxide layer is copper oxide.

Preferably, the thickness of the N-type oxide layer is 3 nm to 200 nm.

Preferably, the thickness of the P-type oxide layer is 3 nm to 200 nm.

Preferably, the bottom electrode and the top electrode are both inert electrodes with a thickness of 2 nm to 200 nm.

To achieve the above purpose, in the second aspect, the disclosure provides a control method for the reconfigurable heterojunction memristor as described in the first aspect, which includes the following.

Reconfiguration from analog type to digital type: The bottom electrode is grounded, and a positive bias is applied to the top electrode in contact with the P-type oxide layer for a certain period of time, thereby a redox reaction is caused in the silver oxide layer/copper oxide layer and an Ag conductive filament/Cu conductive filament is formed between the N-type oxide layer and the top electrode. Through forming or rupturing the conductive filament, two digital states of the device, on or off, are realized.

Reconfiguration from digital type to analog type: The bottom electrode is grounded, and a negative bias is applied to the top electrode in contact with the P-type oxide layer for a certain period of time, thereby the Ag conductive filament/Cu conductive filament between the N-type oxide layer and the top electrode is caused to break and return to the analog type, and analog characteristics with multiple resistance states are exhibited based on charge trapping and releasing.

Preferably, the operating voltage of the analog type memristor is in a range of −1V to 1V, and the operating voltage of the digital type memristor is in a range of −0.5V to 0.5V.

Preferably, the voltage applied to the memristor when being converted from analog type to digital type is greater than 1.2V and the time applied is greater than 1s.

Preferably, the voltage applied to the memristor when being converted from digital type to analog type is less than −0.8 V and the time applied is greater than 1s.

To achieve the above purpose, in the third aspect, the disclosure provides a fabrication method of a reconfigurable heterojunction memristor as described in the first aspect, which includes the following.

(1) A substrate material is ultrasonically cleaned in acetone, anhydrous ethanol, and deionized water respectively, and then dried with nitrogen.

(2) Using magnetron sputtering, molecular beam epitaxy, atomic layer deposition, pulsed laser deposition, or electrochemical methods, a bottom electrode, a heterojunction intermediate layer, and a top electrode are sequentially fabricated on the substrate.

(3) The samples are placed in acetone, anhydrous ethanol, and deionized water respectively, and then dried with nitrogen.

To achieve the above purpose, in the fourth aspect, the disclosure provides an application of a reconfigurable heterojunction memristor as described in the first aspect, in which the heterojunction memristor is applied to brain-like neuromorphic computing or threshold switching.

In general, the above technical solution conceived by the disclosure has the following beneficial effects compared with the related art.

(1) The disclosure discloses a reconfigurable heterojunction memristor, in which the heterojunction intermediate layer includes an N-type oxide layer in contact with a bottom electrode, and a P-type oxide layer in contact with a top electrode; the N-type oxide layer is silver peroxide, and the P-type oxide layer is silver oxide; alternatively, the N-type oxide layer is copper peroxide, and the P-type oxide layer is copper oxide. The functional layer designed by the disclosure comprises a PN heterojunction of n-AgO and p-Ag$_2$O or a PN heterojunction of n-CuO$_2$ and p-CuO. In the analog type, multi-resistance state performance is exhibited based on charge trapping and releasing, and self-rectification characteristics are exhibited, without the need for a selector, which facilitates large-scale integration; in the digital type, the presence of Ag/Cu ions in the layer contributes to the formation of Ag/Cu conductive filaments, the switching threshold voltage is small, and the advantages of fast switching speed and low switching power consumption are provided.

(2) The disclosure discloses a control method for an analog type-digital type reconfigurable heterojunction memristor. When scanning under a small bias voltage, the I-V characteristics of the heterojunction memristor behave as an analog type memristor; when a large positive bias is applied for a certain period of time, the Ag ions/Cu ions in the P-type oxide layer move toward the cathode under the action of the electric field, be reduced near the cathode, and form Ag conductive filaments/Cu conductive filaments, thereby the device is converted into a digital type memristor dominated by Ag/Cu conductive filaments. When a large negative bias is applied for a certain period of time, a reverse reaction occurs, the Ag conductive filament/Cu conductive filament is caused to break, and the device is reconfigured from a digital type to an analog type memristor again. The disclosure realizes analog-digital reconfiguration of a PN heterojunction device of an N-type oxide layer and a P-type oxide layer between a self-rectifying analog type device and a digital type device through electrochemical principles. The device has a simple structure and is suitable for various forms of in-memory computing, and has broad application prospects.

DESCRIPTION OF THE EMBODIMENTS

In order to make the purpose, technical solutions, and advantages of the disclosure more comprehensible, the disclosure is further described in detail below together with the accompanying drawings and embodiments. It should be understood that the specific embodiments described herein are only used to explain the disclosure, and the embodiments are not used to limit the disclosure.

Figure 1:
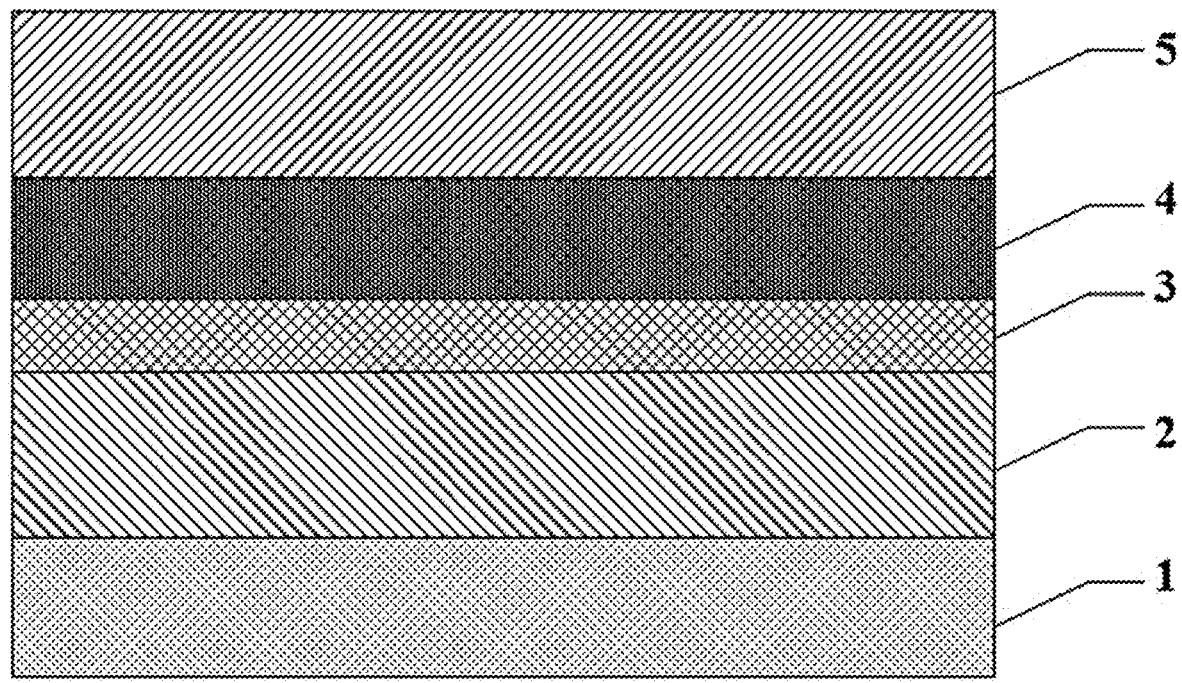
FIG. 1 is a schematic diagram of a film structure of a reconfigurable heterojunction memristor provided by the disclosure.

As shown in FIG. 1, the disclosure provides a reconfigurable heterojunction memristor, which includes a substrate 1, a bottom electrode 2, a heterojunction intermediate layer, and a top electrode 5 stacked sequentially from bottom to top; the heterojunction intermediate layer includes an N-type oxide layer 3 in contact with the bottom electrode, and a P-type oxide layer 4 in contact with the top electrode; the N-type oxide layer is silver peroxide, and the P-type oxide layer is silver oxide; alternatively, the N-type oxide layer is copper peroxide, and the P-type oxide layer is copper oxide.

Preferably, the thickness of the N-type oxide layer is 3 nm to 200 nm.

Preferably, the thickness of the P-type oxide layer is 3 nm to 200 nm.

Preferably, the bottom electrode and the top electrode are both inert electrodes with a thickness of 2 nm to 200 nm. The inert electrodes are Pt, ITO, Ti, W, Au, Pd, n-Si, and p-Si.

The disclosure provides a control method for the reconfigurable heterojunction memristor, which includes the following.

Reconfiguration from analog type to digital type: The bottom electrode is grounded, and a positive bias is applied to the top electrode in contact with the P-type oxide layer for a certain period of time, thereby a redox reaction is caused in the silver oxide layer/copper oxide layer and an Ag conductive filament/Cu conductive filament is formed between the N-type oxide layer and the top electrode. Through forming or rupturing the conductive filament, two digital states of the device, on or off, are realized.

Reconfiguration from digital type to analog type: The bottom electrode is grounded, and a negative bias is applied to the top electrode in contact with the P-type oxide layer for a certain period of time, thereby the Ag conductive filament/ Cu conductive filament between the N-type oxide layer and the top electrode is caused to break and return to the analog type, and analog characteristics with multiple resistance states are exhibited based on charge trapping and releasing.

Preferably, the operating voltage of the analog type memristor is in a range of −1V to 1V, and the operating voltage of the digital type memristor is in a range of −0.5V to 0.5V.

Preferably, the voltage applied to the memristor when being converted from analog type to digital type is greater than 1.2V and the time applied is greater than 1s.

Preferably, the voltage applied to the memristor when being converted from digital type to analog type is less than −0.8 V and the time applied is greater than 1s.

The disclosure provides a fabrication method of the reconfigurable heterojunction memristor, which includes the following.

(1) A substrate material is ultrasonically cleaned in acetone, anhydrous ethanol, and deionized water respectively, and then dried with nitrogen.

(2) Using magnetron sputtering, molecular beam epitaxy, atomic layer deposition, pulsed laser deposition, or electrochemical methods, a bottom electrode, a heterojunction intermediate layer, and a top electrode are sequentially fabricated on the substrate.

(3) The samples are placed in acetone, anhydrous ethanol, and deionized water respectively, and then dried with nitrogen.

The disclosure provides an application of the reconfigurable heterojunction memristor, and the heterojunction memristor is applied to brain-like neuromorphic computing or threshold switching.

Example 1

This embodiment is a five-layer planar structure memristor unit, both the top and bottom electrodes are made of Pt, and the specific fabrication process is as follows.

(1) A silicon wafer with a crystal plane index of (100) and a thickness of 500 μm is selected, a $SiO_2$ thin film layer with a thickness of 1 μm is thermally grown on the surface of the silicon wafer, and the silicon wafer is used as a substrate. The substrate is cut into sample pieces of 1×1 cm, placed in acetone to soak, cleaned in an ultrasonic environment for 10 to 15 minutes, placed in anhydrous ethanol to soak, and ultrasonically cleaned for 5 minutes, in which the ultrasonic power are all 40 W. Finally, the sample pieces are cleaned with deionized water, and dried with a nitrogen gun.

(2) The sample piece cleaned is taken, and a layer of bottom electrode Pt with a thickness of approximately 100 nm is grown on the surface thereof using magnetron sputtering, and the result is used as the bottom electrode. In order to increase the adhesion between the Pt electrode layer and the substrate, DC sputtering may be performed on a Ti adhesion layer of approximately 10 nm first, and then DC sputtering may be performed on the Pt target, in which a sputtering power is 200 W, an Ar gas atmosphere is 0.5 Pa, and a sputtering time is 1000 s.

(3) $AgO/Ag_2O$ layer is fabricated by magnetron sputtering. Ag is used as target material. AC sputtering is used in the process. During the sputtering process, the thickness of the double-layer dielectric layer is regulated by controlling the sputtering time. In this way, the dielectric layer AgO and the dielectric layer $Ag_2O$ are obtained respectively. In this embodiment, $O_2$:Ar-40:40 is used to grow the AgO layer, and $O_2$:Ar=24:40 is used to grow the $Ag_2O$ layer. In terms of film thickness, the thicknesses of the AgO layer and the $Ag_2O$ layer are 10 nm and 30 nm respectively.

(4) A square lithography pattern is prepared on the dielectric layer $Ag_2O$ by photolithography, and the size of the top electrode is 100 μm×100 μm, in which the steps of the photolithography process includes coating, pre-bake, exposure, reversal bake, flood exposure (to make the photoresist reverse), and development.

(5) A Pt layer of 100 nm is grown on the photolithographically processed sample using magnetron sputtering, in which the sputtering power is 200 W, the Ar gas atmosphere is 0.5 Pa, the sputtering time is 1000 s; and then the top electrode is obtained.

(6) The film sample prepared in step (5) is placed in acetone to soak for 30 to 50 minutes and cleaned with anhydrous ethanol and deionized water, and then the sample is dried with nitrogen.

After completing the above steps, a $Pt/AgO/Ag_2O/Pt$ memristor unit is prepared.

Figure 2:
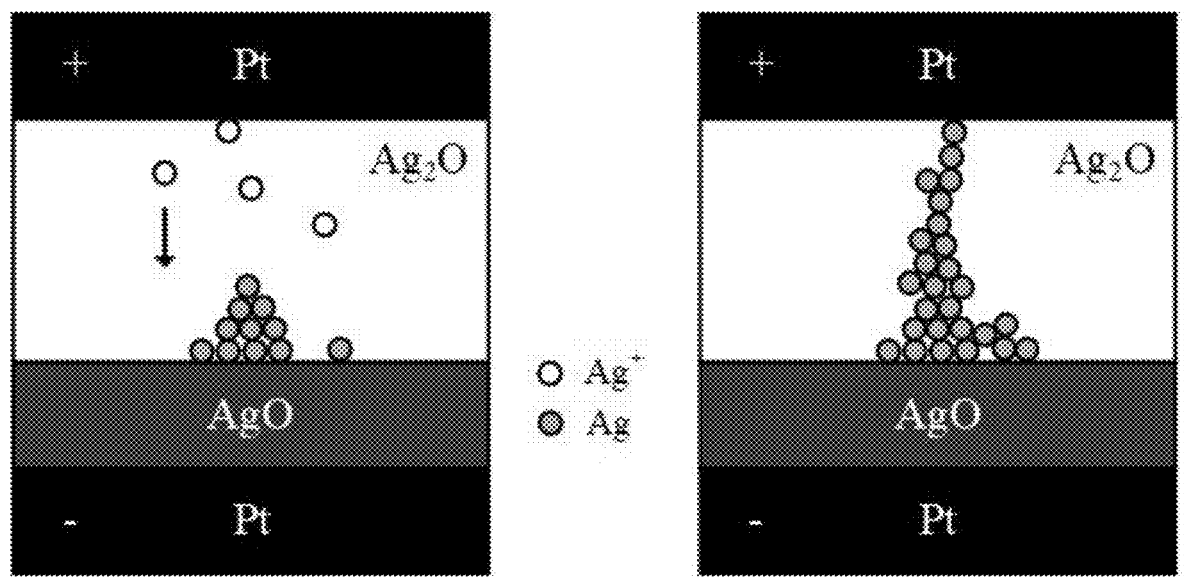
FIG. 2 is a schematic diagram of a reconfiguring principle from analog type to digital type of an analog type-digital type reconfigurable memristor provided in Example 1 of the disclosure.

As shown in FIG. 2, when scanning under a small bias voltage, the I-V characteristics of the $Pt/AgO/Ag_2O/Pt$ memristor unit behave as an analog type memristor; when a large positive bias is applied for a certain period of time, the Ag ions in the $Ag_2O$ dielectric layer move toward the cathode under the action of the electric field, be reduced near the cathode, and form Ag conductive filaments, thereby the device is converted into a digital type memristor dominated by Ag conductive filaments.

Figure 3:
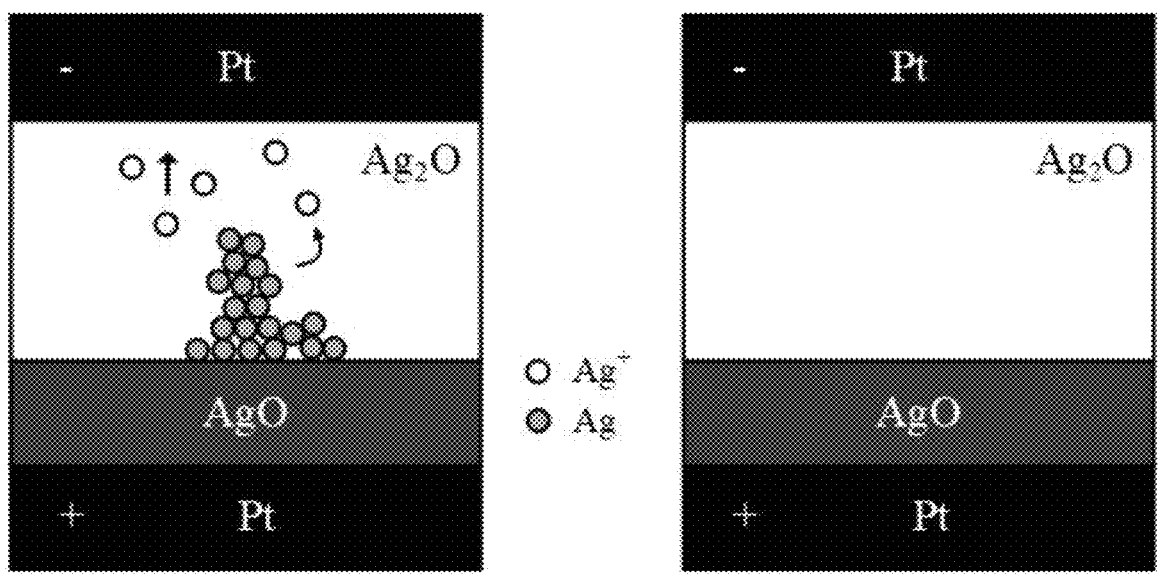
FIG. 3 is a schematic diagram of a reconfiguring principle from digital type to analog type of the analog type-digital type reconfigurable memristor provided in Example 1 of the disclosure.

As shown in FIG. 3, when a large negative bias is applied for a certain period of time, a reverse reaction occurs, the Ag conductive filament is caused to break, and the $Pt/AgO/Ag_2O/Pt$ memristor unit is reconfigured from a digital type memristor to an analog type memristor again.

Example 2

In this embodiment, a semiconductor device analyzer B1500 is used to perform I/V scanning under direct current and high-speed switching characteristic testing under pulse on the memristor unit prepared in Example 1.

Figure 4:
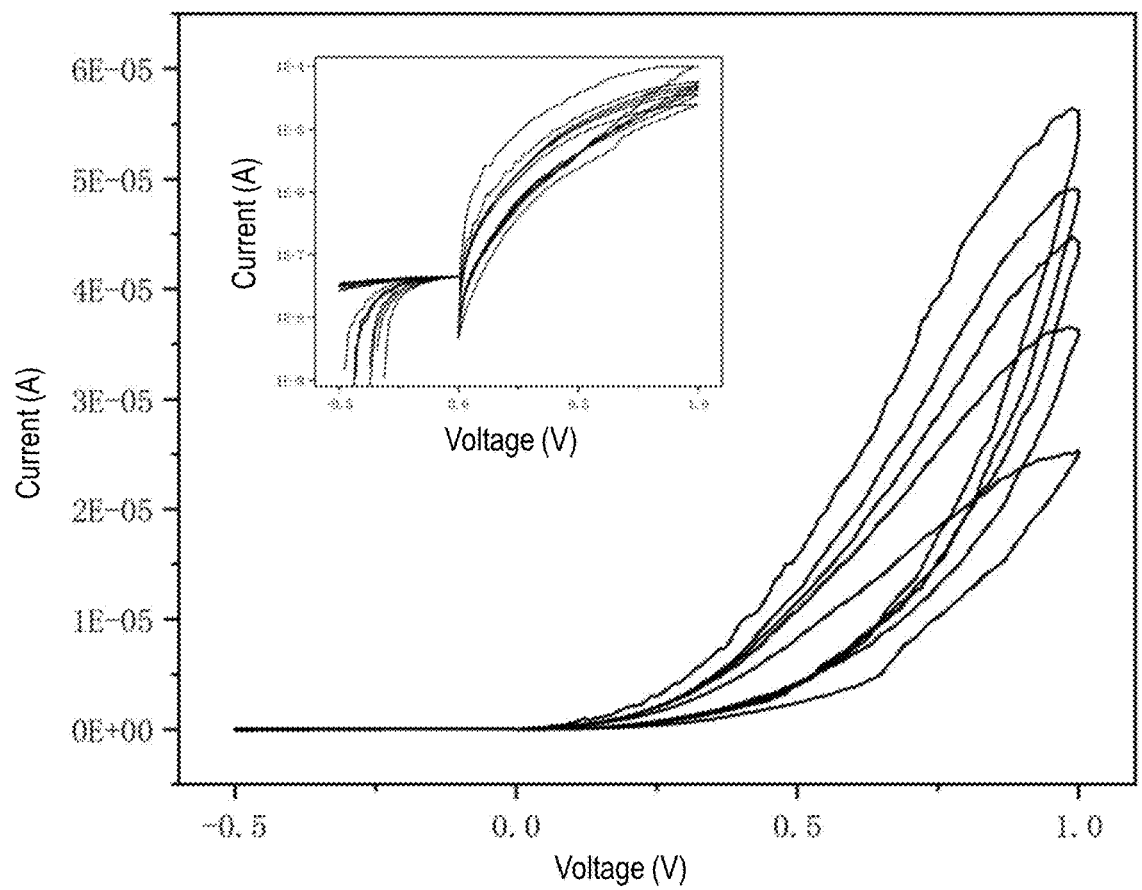
FIG. 4 is a linear I-V curve diagram under continuous voltage scanning when a memristor provided by Example 2 of the disclosure behaves as an analog type memristor, and the inset is a current logarithmic I-V curve diagram.

FIG. 4 is a linear I-V curve diagram under continuous voltage scanning of a $Pt/AgO/Ag_2O/Pt$ memristor after fabrication and without bias reconfiguration treatment according to an embodiment of the disclosure, and the inset is a current logarithmic I-V curve diagram, in which the device unit is subjected to multiple consecutive positive DC I/V voltage scans and multiple consecutive negative scans, the positive voltage scan is controlled in a range of 0V to 1V, the negative voltage scan is controlled in a range of −0.5V to 0V, and the limiting current is set to 100 μA. It may be seen from FIG. 4 that during continuous scanning in the same direction, the hysteresis curve changes stably in one direction, which is consistent with the characteristics of the analog type memristor, that is, the drawing shows that the device conductance value may be continuously and directionally changed during repeated application of stimulation. In addition, the current ratio between the positive scan and the negative scan is large. Compared with the previous memristor that requires the addition of a selector, this analog type memristor has a self-rectification function. Therefore, a selector structure is not required during large-scale integration, which can greatly improve the integration level.

Figure 5:
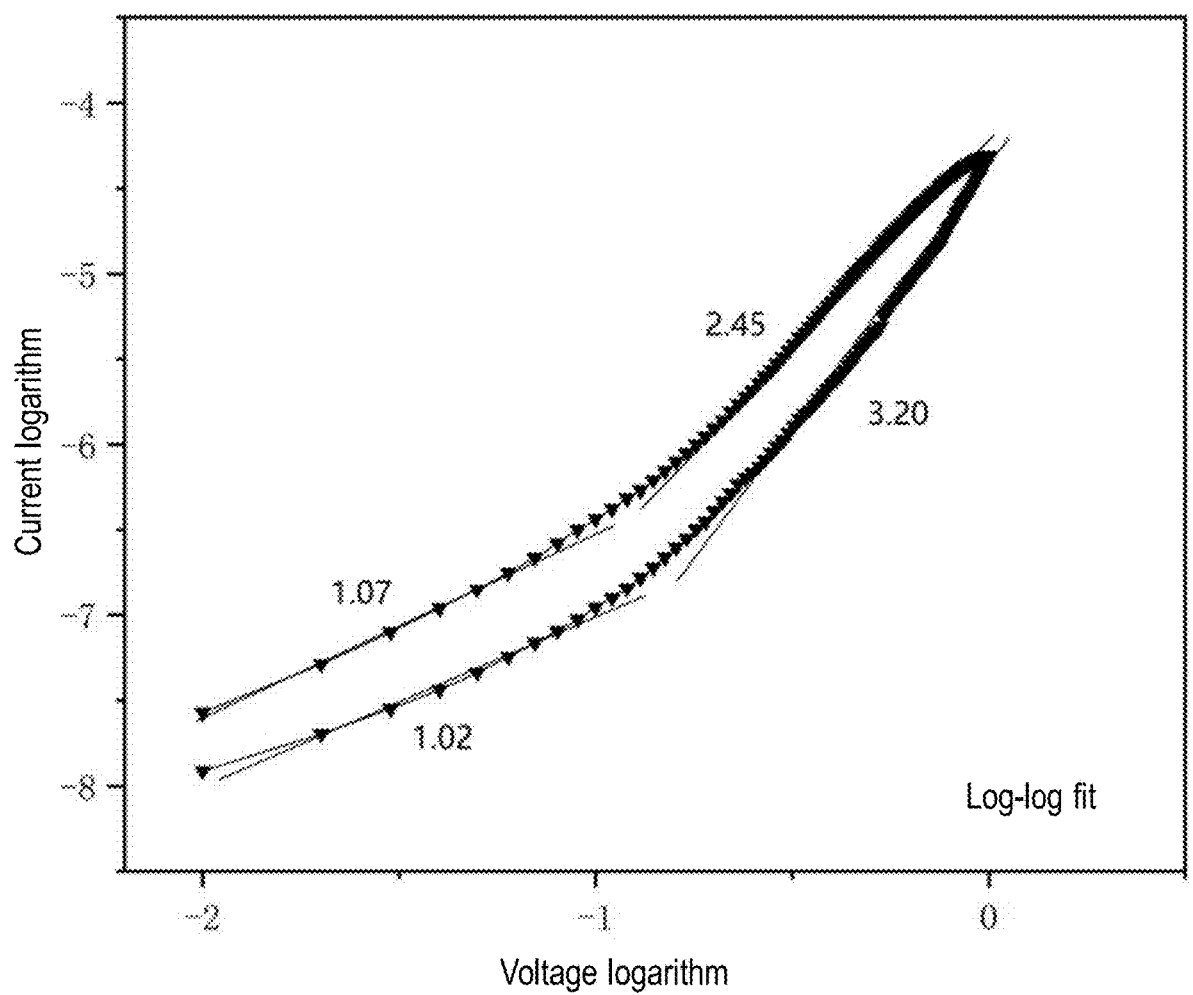
FIG. 5 is a one-time double-logarithmic I-V curve diagram under continuous voltage scanning when the memristor provided by Example 2 of the disclosure behaves as the analog type memristor.

FIG. 5 is a double logarithmic I-V curve obtained by a one-time scan of the $Pt/AgO/Ag_2O/Pt$ memristor after the fabrication is completed and without bias reconfiguration treatment according to an embodiment of the disclosure, in which the device unit is subjected to multiple consecutive positive DC I/V voltage scans, and one of the scans is selected for double logarithmic processing. The positive voltage scan is controlled in a range of 0V to 1V, and the limiting current is set to 100 μA. By fitting the double logarithmic IV curve, it may be seen that the IV characteristics of the device show a notable double-segment power-law characteristic, which is consistent with the space charge limited current effect based on charge trapping and releasing, indicating that the physical mechanism of its simulated characteristics is the charge trapping and releasing mechanism. In the low voltage region, the slope of the curve is close to 1, which is the ohmic region. In the medium and high voltage region, the slope of the curve is greater than 2, which is the current steep increase region.

Figure 6:
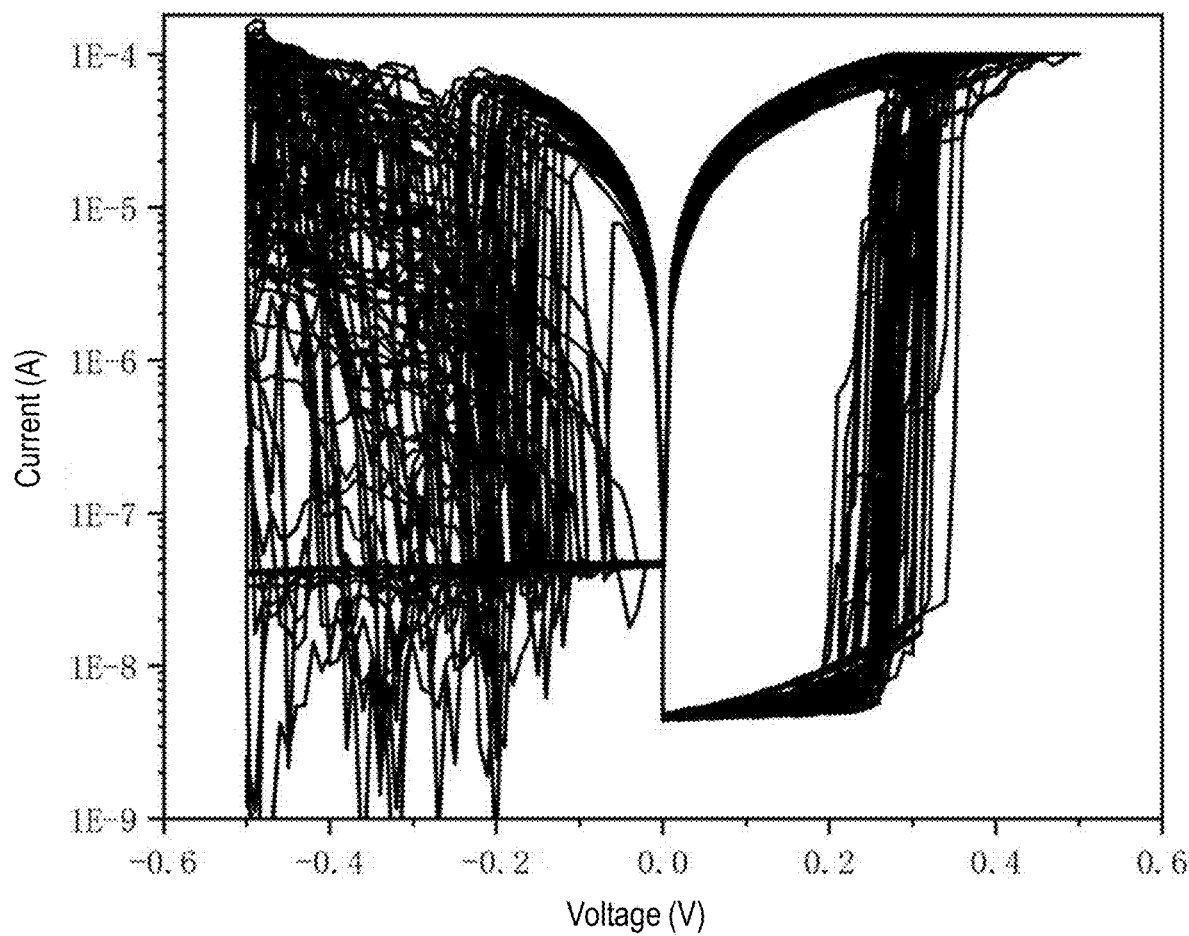
FIG. 6 is a linear I-V curve diagram under continuous voltage scanning of the memristor provided by Example 2 of the disclosure after being reconfigured into a digital type memristor through positive bias treatment.

FIG. 6 is an I-V curve diagram under continuous voltage scanning of a Pt/AgO/Ag$_2$O/Pt memristor after being subjected to positive bias treatment for a certain period of time according to an embodiment of the disclosure, in which the bottom electrode is grounded, and a scanning voltage is applied to the top electrode. The unit is subjected to multiple bidirectional DC I/V voltage scans. The voltage scan is controlled in a range of −0.5V to 0.5V, and the limiting current is set to 100 μA. As may be seen from FIG. 6, there is a resistance window during the forward scan, and a stable abrupt resistance switching occurs, which is consistent with the characteristics of a digital type memristor, indicating that the device has been reconfigured into a digital type memristor. Also, the presence of Ag ions in the dielectric layer contributes to the formation of Ag conductive filaments, and the resistance threshold of the device is only approximately 0.2V.

Figure 7:
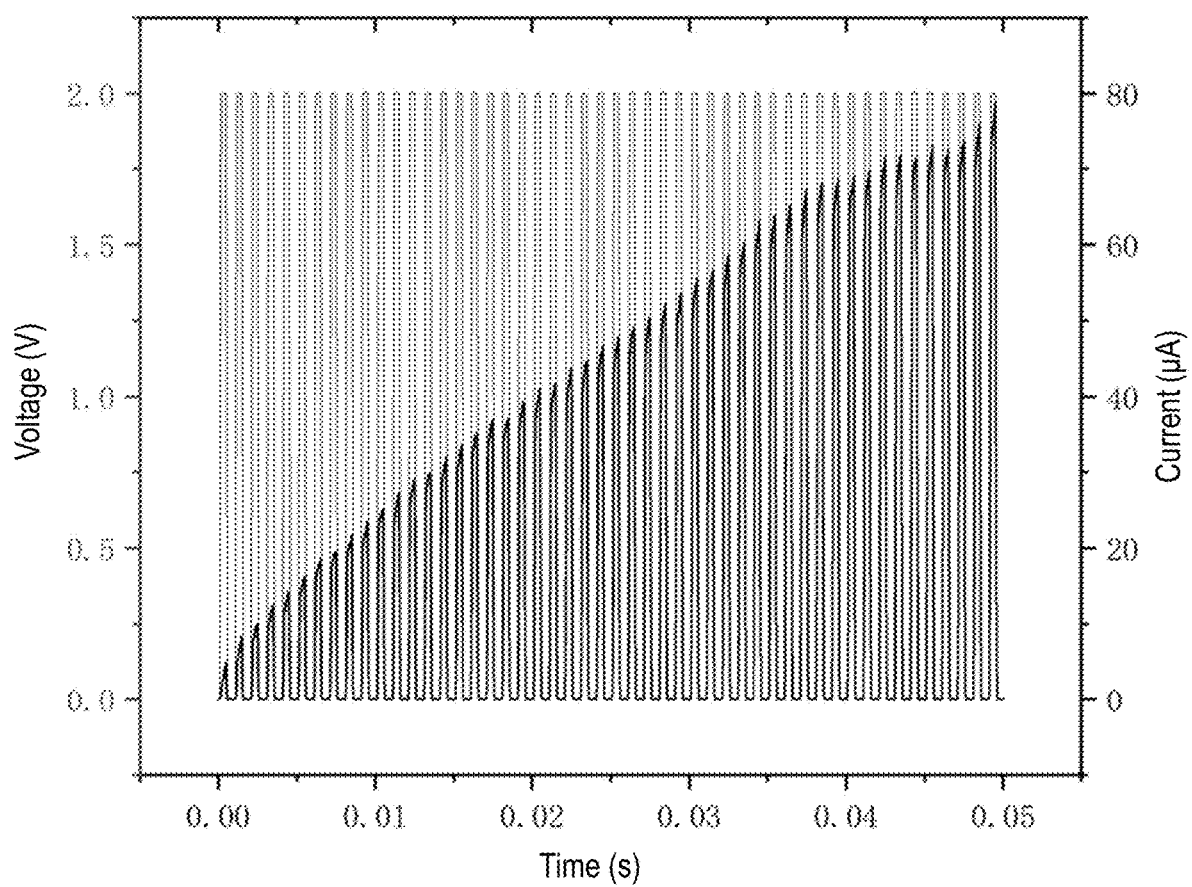
FIG. 7 is a full-band curve diagram of the memristor provided by Example 2 of the disclosure under 50 consecutive pulse scans with an amplitude of 2V, a pulse width of 0.5 μs, and a frequency of 1 kHz.

FIG. 7 is a full-band curve diagram of a Pt/AgO/Ag$_2$O/Pt memristor provided by an embodiment of the disclosure under 50 consecutive positive pulse scans, in which the pulse amplitude is 2V, the pulse width is 0.5 μs, and the frequency is 1 kHz. As may be seen from FIG. 7, the conductance value of the device increases steadily under continuous positive pulse stimulation, showing LTP (long-term potentiation) characteristics consistent with simulated synapses.

Figure 8:
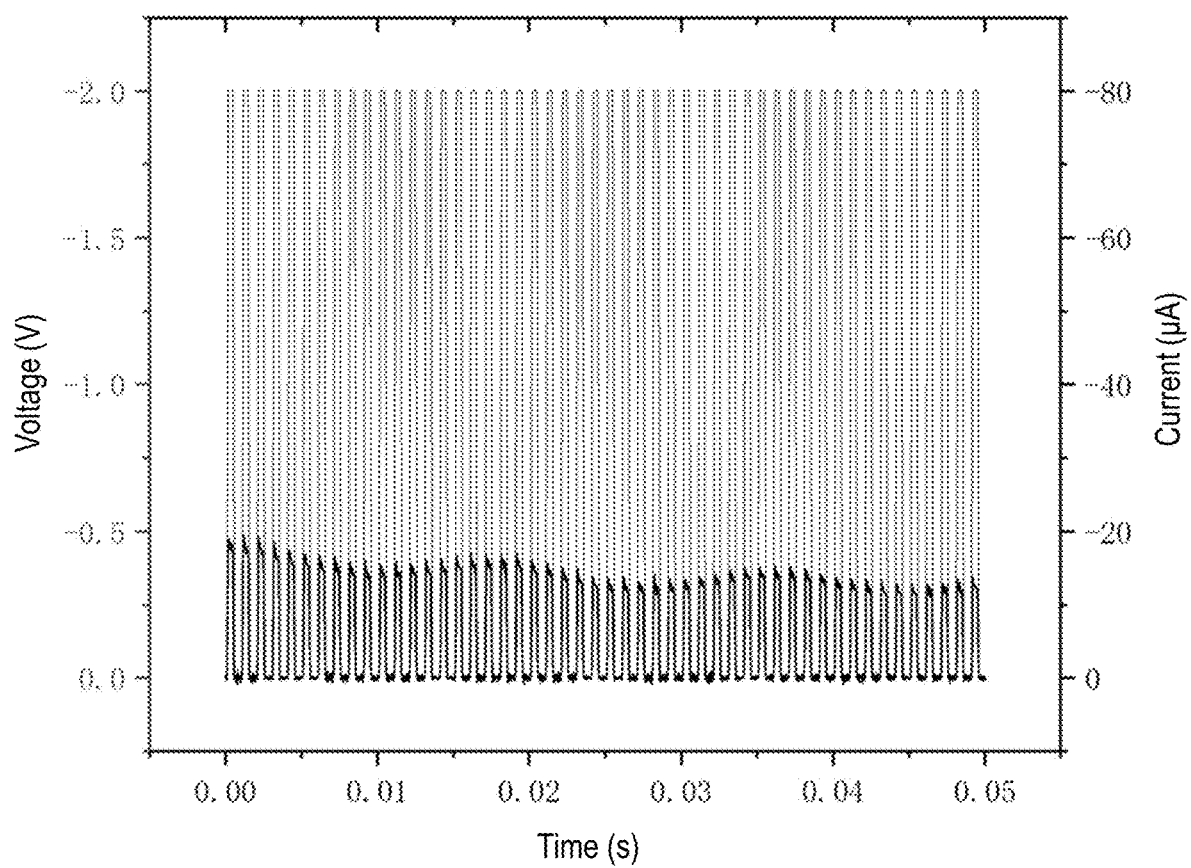
FIG. 8 is a full-band curve diagram of the memristor provided by Example 2 of the disclosure under 50 consecutive pulse scans with an amplitude of −2V, a pulse width of 0.5 μs, and a frequency of 1 kHz.

FIG. 8 is a full-band curve diagram of the Pt/AgO/Ag$_2$O/Pt memristor provided by an embodiment of the disclosure under 50 consecutive negative pulse scans, in which the pulse amplitude is −2V, the pulse width is 0.5 μs, and the frequency is 1 kHz. It may be seen from FIG. 8 that the conductivity of the device decreases slowly under continuous negative pulse excitation, although the linearity is average compared to the LTP characteristics in FIG. 7, it may still be shown to have LTD (long term depression) characteristics that are consistent with the simulated synapses.

Based on the above electrical measurements, it may be found that as follows. (1) The memristor performs multi-value resistance switching based on charge trapping and releasing in analog type, which can realize the analog type synaptic function. (2) Ag$_2$O can undergo redox reaction under the action of bias voltage applied for a certain period of time, thereby Ag conductive filaments are formed between the dielectric layer and the top electrode, thereby analog type is converted to digital type, and analog-digital reconfiguration of the device is achieved. (3) In this memristor, due to the asymmetric potential barrier between AgO and Ag$_2$O and the Pt electrode, when the device is an analog type memristor, the device has a self-rectifying characteristic. (4) In this memristor, the presence of Ag ions in the dielectric layer contributes to the formation of Ag conductive filaments. Therefore, when the device is reconfigured into a digital type memristor, the switching threshold voltage is small, and the advantages of fast switching speed and low switching power consumption are provided.

It is easily understood by persons skilled in the art that the above description is only preferred embodiments of the disclosure and the embodiments are not intended to limit the disclosure. Any modifications, equivalent substitutions, and improvements made within the spirit and principles of the disclosure should be included in the protection scope of the disclosure.

What is claimed is:

1. A reconfigurable heterojunction memristor, comprising a substrate, a bottom electrode, a heterojunction intermediate layer, and a top electrode stacked sequentially from bottom to top, wherein the heterojunction intermediate layer comprises an N-type oxide layer in contact with the bottom electrode and a P-type oxide layer in contact with the top electrode, the N-type oxide layer is silver peroxide, and the P-type oxide layer is silver oxide;

alternatively, the N-type oxide layer is copper peroxide, and the P-type oxide layer is copper oxide.

2. The reconfigurable heterojunction memristor according to claim 1, wherein a thickness of the N-type oxide layer is 3 nm to 200 nm.

3. The reconfigurable heterojunction memristor according to claim 1, wherein a thickness of the P-type oxide layer is 3 nm to 200 nm.

4. The reconfigurable heterojunction memristor according to claim 1 wherein both the bottom electrode and the top electrode are inert electrodes with a thickness of 2 nm to 200 nm.

5. A control method for the reconfigurable heterojunction memristor according to claim 1, comprising:

reconfiguration from an analog type to a digital type: grounding the bottom electrode, applying a positive bias to the top electrode in contact with the P-type oxide layer for a certain period of time to cause a redox reaction in a silver oxide layer/copper oxide layer, forming an Ag conductive filament/Cu conductive filament between the N-type oxide layer and the top electrode, and realizing two digital states of the device, an on state or an off state, through forming or rupturing the Ag conductive filament/Cu conductive filament;

reconfiguration from the digital type to the analog type: grounding the bottom electrode, applying a negative bias to the top electrode in contact with the P-type oxide layer for a certain period of time to cause the Ag conductive filament/Cu conductive filament between the N-type oxide layer and the top electrode to break and return to the analog type, and exhibiting analog characteristics with multiple resistance states based on charge trapping and releasing.

6. The control method according to claim 5, wherein an operating voltage of the reconfigurable heterojunction memristor of the analog type is in a range of −1V to 1V, and an operating voltage of the reconfigurable heterojunction memristor of the digital type is in a range of −0.5V to 0.5V.

7. The control method according to claim 6, wherein the voltage applied to the reconfigurable heterojunction memristor in response to being converted from the analog type to the digital type is greater than 1.2V and a time applied is greater than 1s.

8. The control method according to claim 6, wherein the voltage applied to the reconfigurable heterojunction memristor in response to being converted from the digital type to the analog type is less than −0.8 V and a time applied is greater than 1s.

9. A fabrication method of the reconfigurable heterojunction memristor according to claim 1, comprising:

(1) cleaning ultrasonically a material of the substrate in acetone, anhydrous ethanol, and deionized water respectively, and then drying with nitrogen;

(2) using magnetron sputtering, molecular beam epitaxy, atomic layer deposition, pulsed laser deposition, or electrochemical methods, preparing the bottom electrode, the heterojunction intermediate layer, and the top electrode sequentially on the substrate;

(3) placing samples in acetone, anhydrous ethanol, and deionized water respectively, and then drying with nitrogen.

* * * * *